United States Patent
Holmes

(10) Patent No.: US 8,380,454 B2
(45) Date of Patent: Feb. 19, 2013

(54) ELECTRICAL EQUIPMENT ASSEMBLY AND METHOD OF CALIBRATING AN ELECTRICAL EQUIPMENT ASSEMBLY

(75) Inventor: John Steven Holmes, Louisville, KY (US)

(73) Assignee: General Electric Company, Schenectady, NY (US)

( * ) Notice: Subject to any disclaimer, the term of this patent is extended or adjusted under 35 U.S.C. 154(b) by 431 days.

(21) Appl. No.: 12/541,672

(22) Filed: Aug. 14, 2009

(65) Prior Publication Data

US 2011/0040512 A1 Feb. 17, 2011

(51) Int. Cl.
*G01D 18/00* (2006.01)
(52) U.S. Cl. .......................................................... 702/87
(58) Field of Classification Search ..................... 702/87
See application file for complete search history.

(56) References Cited

U.S. PATENT DOCUMENTS

| | | | |
|---|---|---|---|
| 6,636,028 B2 * | 10/2003 | Lavoie et al. | 324/74 |
| 6,688,119 B2 | 2/2004 | Holmes | |
| 7,359,809 B2 * | 4/2008 | Bruno | 702/64 |
| 2003/0010089 A1 | 1/2003 | Holmes | |
| 2008/0018327 A1 | 1/2008 | Reynolds | |
| 2011/0265550 A1 * | 11/2011 | Penth et al. | 73/23.2 |

FOREIGN PATENT DOCUMENTS

JP 2006105808 A 4/2006
JP 2008014740 A 1/2008

* cited by examiner

*Primary Examiner* — Aditya Bhat
(74) *Attorney, Agent, or Firm* — Cantor Colburn LLP

(57) ABSTRACT

An electrical equipment assembly includes at least one electrical device provided with an identifier member. The identifier member includes a measurement tolerance data associated with the electrical device. The electrical assembly also includes a meter electrically coupled to the electrical device. The meter includes a memory device, a processor device operatively coupled to the memory device, a communication link member operatively coupled to the processor device, and a selectively updatable measurement tolerance indicator stored in one of the memory device, the processor device. The processor device being configured and disposed to establish measurement accuracy of the meter based on the tolerance indicator stored in the memory device.

17 Claims, 2 Drawing Sheets

ELECTRICAL EQUIPMENT ASSEMBLY AND METHOD OF CALIBRATING AN ELECTRICAL EQUIPMENT ASSEMBLY

BACKGROUND OF THE INVENTION

The subject matter disclosed herein relates to the art of electrical equipment and, more particularly, to an electrical equipment assembly and a method of calibrating an electrical equipment assembly.

Electrical power protection equipment systems typically include a power transformer, a current transformer or Rogowski, a command trip unit and an interruption device (circuit breaker). Often times a meter is added to the power protection equipment to aid application engineers in facility management. In order to ensure proper metering, each component of the power protection equipment is calibrated and a measurement tolerance determined. The components are then assembled and the protection equipment is installed into a facility. However, while many of the individual components are individually calibrated, overall measurement accuracy is a function of the tolerances of each component. With this arrangement, eliminating measurement error is very difficult.

In order to address this issue, manufactures hold calibration until final assembly. Once final assembly is complete, a known current is injected into the electrical system. An output of the system is requested from the command trip unit and is compared with the known current. Any difference between the known current and the measured current determines an offset value that is used to calibrate the protection equipment. A similar off-set value is also calculated for voltage. While effective at minimizing measurement error, all calibration must be done at the time of final assembly. As such, any in field replacement of protection equipment components will introduce errors into the system and accuracy will be lost.

BRIEF DESCRIPTION OF THE INVENTION

According to one aspect of the invention, an electrical equipment assembly includes at least one electrical device provided with an identifier member. The identifier member indicates a measurement tolerance data associated with the electrical device. The electrical assembly also includes a meter electrically coupled to the electrical device. The meter includes a memory device, a processor device operatively coupled to the memory device, a communication link member operatively coupled to the processor device, and a selectively updatable measurement tolerance indicator stored in one of the memory device and the processor device. The processor device being configured and disposed to establish measurement accuracy of the meter based on the tolerance indicator stored in the memory device.

According to another aspect of the invention, a method of calibrating an electrical equipment assembly includes electrically connecting at least one electrical device and a meter, providing a communication device configured to be connectable with the meter, connecting the communication device to a communication link member provided on the meter, obtaining measurement tolerance data from an identifier member provided on the at least one electrical device, inputting the measurement tolerance to a memory operatively associated with the meter, and establishing a tolerance indicator based on the measurement tolerance data to calibrate the meter.

These and other advantages and features will become more apparent from the following description taken in conjunction with the drawings.

BRIEF DESCRIPTION OF THE DRAWING

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
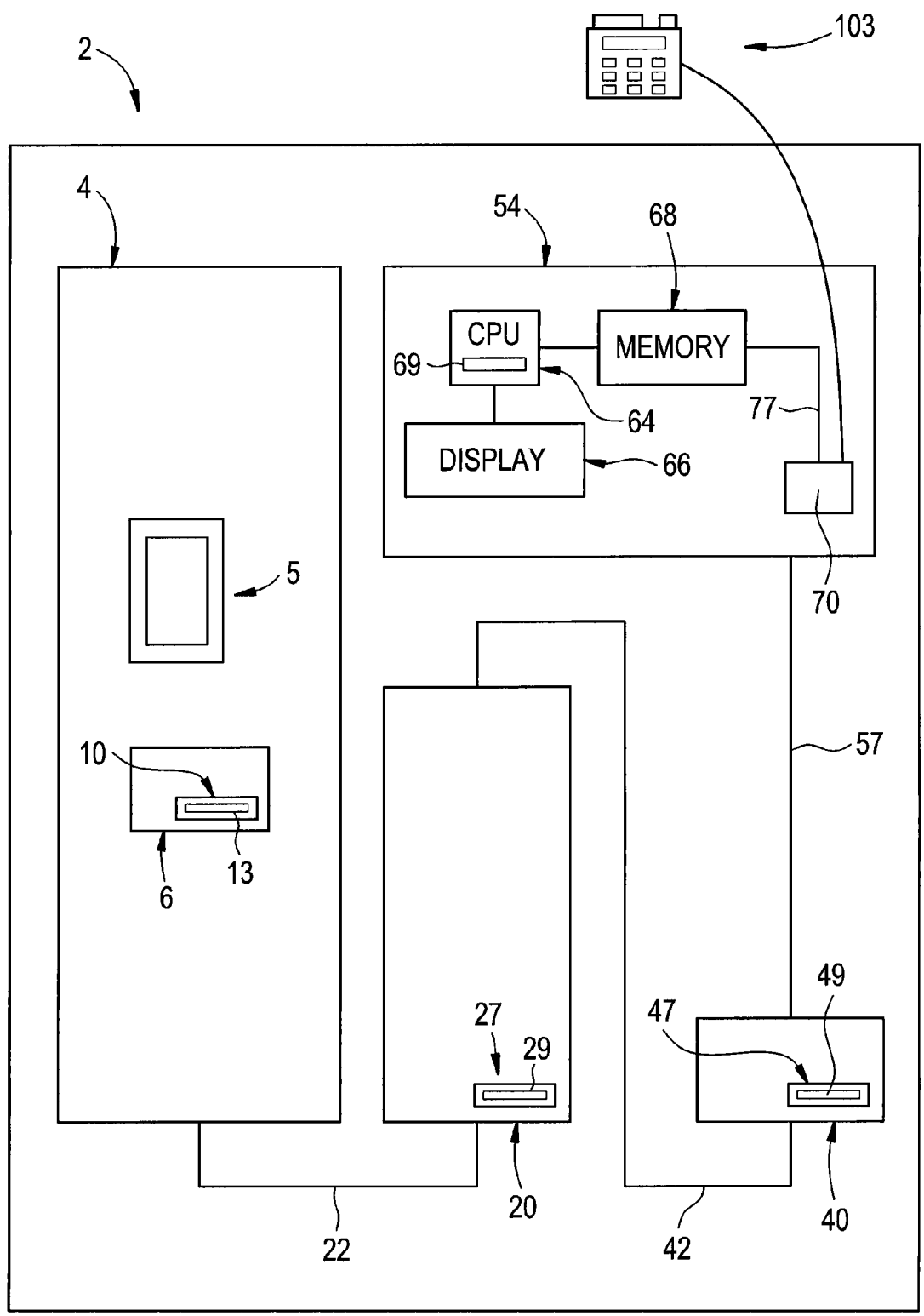
FIG. 1 is block diagram illustrating an electrical assembly in accordance with an exemplary embodiment.

With reference to FIG. 1, an electrical equipment assembly constructed in accordance with an exemplary embodiment is indicated generally at 2. The electrical equipment assembly 2 takes the form of protection equipment composed of a plurality of electrical devices. In the exemplary embodiment shown, electrical equipment assembly 2 includes an interruption device 4 having a switch element 5 and a trip unit 6. Trip unit 6 includes an identifier member 10 that includes measurement tolerance data 13. Measurement tolerance data 13 represents, for example, an off-set value specific to trip unit 6. Electrical equipment assembly 2 also includes a voltage transformer 20 that is electrically connected to interruption device 4 via an electrical connection/cable 22. Voltage transformer 20 includes an identifier member 27 that is provided with measurement tolerance data 29 associated with voltage transformer 20. Electrical equipment assembly 2 is further shown to include current transformer 40 that is electrically connected to voltage transformer 20 via an electrical connection/cable 42. Current transformer 40 can take on a variety of forms such as, for example, a Rogowksi. Current transformer 40 is shown to include an identifier member 47 having measurement tolerance data 49. In a manner similar to that described above, measurement tolerance data 49 is associated with current transformer 40. Measurement tolerance data 13, 29 and 49 is shown in the form of a label that can include information presented in a bar-code, alpha-numeric characters and/or radio frequency identification data (RFID). As will be described more fully below, measurement tolerance data 13, 29 and 49 are employed to in connection with establishing an overall calibration for electrical equipment assembly 2.

As further shown in FIG. 1, electrical equipment assembly 2 includes a meter 54. Meter 54 is employed to determine an electrical parameter associated with electrical equipment assembly 2. Meter 54 is electrically connected to current transformer 40 via an electrical connection/cable 57. Of course, it should be understood that meter 54 could also be integral to, for example, interruption device 4. In any event, meter 54 includes a processor device or CPU 64 that is operatively connected to a display 66 and a memory device 68. As will be discussed more fully below, CPU 64 calculates a calibration factor that is utilized to establish a selectively updatable tolerance indicator 69 that ensures measurement accuracy for meter 54. Towards that end, memory device 68 is operatively connected to a communication link member 70 via a bus 77. At this point, it should be understood that communication link member 70 can take on a variety of forms such as, for example, a universal serial bus connection (USB) a mod bus connection, Bluetooth® connection, or an infra red (IR) connection or simply include input members such as a keyboard for passing information to memory device 68, and CPU 64.

Figure 2:
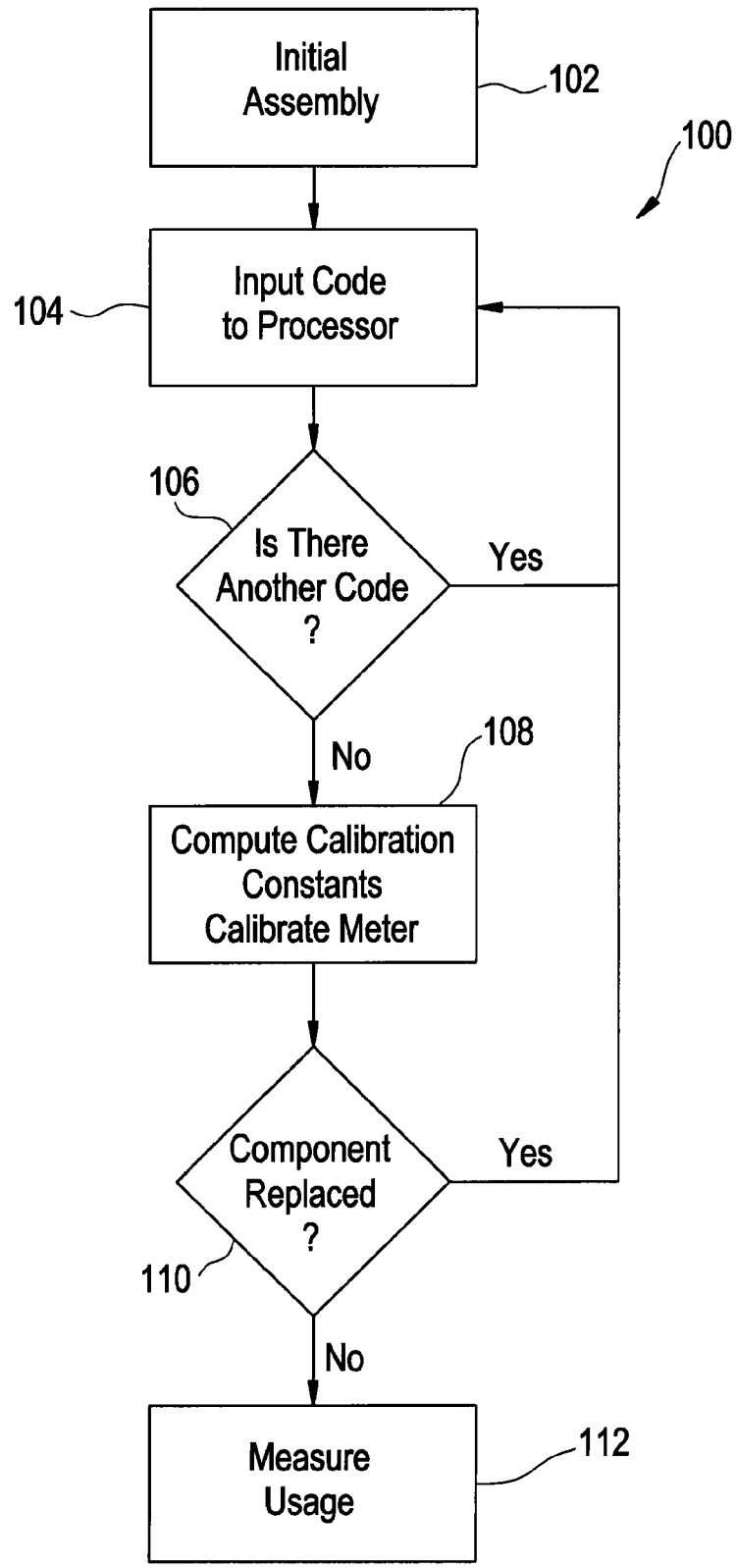
FIG. 2 is flow diagram illustrating a method of calibrating an electrical equipment assembly in accordance with an exemplary embodiment.

Reference will now be made to FIG. 2 in describing a method 100 of calibrating electrical assembly 2. As shown, electrical assembly 2 is initially assembled as indicated in block 102. As noted above, many of the components of electrical assembly 2 include identifier member that provides measurement tolerance data associated with the corresponding electrical device. That is, during assembly, a known precise source characterization is input to each electrical device and an output is measured. An offset value, representing a difference between the known input and the output, is calculated and provided on the identifier member. As noted above, the measurement tolerance data can be provided on the identifier member in a number of forms, including an alphanumerical label, a bar-code label, and radio frequency identifier (RFID) or the like. After assembly, measurement tolerance data from each component/device associated with electrical assembly 2 is input to CPU 64 via memory 68 through a communication link device 103 (FIG. 1) connected to communication link member 70 as indicated in block 104. Communication link device 103 is shown in the form of a hand-held device including a keyboard, a bar-code scanner and an RFID reader (not separately labeled). However, it should be understood that communication link device 103 can take on a variety of forms. After inputting all measurement tolerance data, a determination is made, in block 106, whether any additional measurement tolerance data should be input to CPU 64. Once all measurement tolerance data is input into CPU 64, a calibration constant is calculated setting a tolerance indicator for electrical equipment assembly 2 as indicated in block 108. The tolerance indicator is utilized to calibrate meter 57 in order to provide high measurement accuracy of the electrical parameter associated with electrical device 2. Once calibrated, the electrical parameter is monitored as indicated in block 112.

Over time, it may be necessary to replace one of the electrical devices associated with electrical assembly 2. Towards that end, a determination is made whether an electrical device is replaced in block 110. If an electrical device is replaced, new measurement tolerance data associated with the replaced electrical device is input into processor 64 via memory 68. After inputting the new measurement tolerance data, a determination is made in block 106 whether any additional measurement tolerance data should be input in a manner similar to that described above. Once all measurement tolerance data associated with replaced components is input into CPU 64 via memory 68, a new calibration constant is calculated setting a new tolerance indicator for electrical equipment assembly 2. The tolerance indicator is utilized to re-calibrate meter 57 in order to provide high measurement accuracy of the electrical parameter associated with electrical device 2. Once re-calibrated, the electrical parameter is monitored as indicated in block 112 such that measurement accuracy of meter 54 remains constant. With this arrangement, not only is the measurement accuracy of meter 54 accurate after initial shipment, but measurement accuracy is maintained throughout an overall operational life of electrical assembly 2 by enabling meter 54 to be updated with tolerance data each time an electrical device is replaced.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. An electrical equipment assembly comprising:
    at least one electrical device including an identifier member, the identifier member including a measurement tolerance data associated with the at least one electrical device, the measurement tolerance data being configured to establish, at least in part, an overall calibration of the electrical equipment assembly; and
    a meter electrically coupled to the at least one electrical device, the meter including a memory device, a processor device operatively coupled to the memory device, a communication link member operatively coupled to the processor device, and a selectively updatable measurement tolerance indicator stored in one of the memory device and the processor device, the processor device configured and disposed to establish a measurement accuracy of the meter based on the measurement tolerance indicator stored in the memory device.

2. The electrical equipment assembly according to claim 1, wherein the at least one electrical device is one of a power transformer, a current transformer, and a trip unit.

3. The electrical equipment assembly according to claim 1, wherein the at least one electrical device includes a plurality of interconnected electrical devices, each of the plurality of interconnected electrical devices comprising an identifier member indicating a measurement tolerance data associated with a respective one of the plurality of electrical devices.

4. The electrical equipment assembly according to claim 3, wherein the plurality of interconnected electrical devices includes at least two of a power transformer, a current transformer, and a trip unit.

5. The electrical equipment assembly according to claim 1, wherein the identifier member is one of a bar code, an alphanumeric code, and a radio frequency identification device (RFID).

6. The electrical equipment assembly according to claim 1, wherein the communication link member includes a mod bus.

7. The electrical equipment assembly according to claim 1, wherein the communication link member includes a universal serial bus (USB).

8. The electrical equipment assembly according to claim 1, wherein the communication link member includes a keyboard.

9. A method of calibrating an electrical equipment assembly, the method comprising:
    electrically connecting at least one electrical device to a meter, the at least one electrical device including an identifier member;
    electrically coupling a communication device to the meter;
    passing a measurement tolerance data, configured to establish, at least in part an overall calibration of the electrical equipment assembly, from the identifier member provided on the at least one electrical device to the meter;
    inputting the measurement tolerance data to a memory operatively associated with the meter;
    establishing a tolerance indicator based on the measurement tolerance data; and
    calibrating the meter based on the measurement tolerance data received from the at least one electrical device.

10. The method of claim 9, wherein obtaining a measurement tolerance data includes scanning a bar code provided on the identifier member with a bar code scanner.

11. The method of claim 10, wherein inputting the measurement tolerance includes inputting the measurement tolerance directly from the bar code scanner.

12. The method of claim 9, wherein obtaining a measurement tolerance data includes scanning a radio frequency identification device (RFID) provided on the identifier member.

13. The method of claim 9, wherein inputting the measurement tolerance data includes inputting an alphanumeric code provided on the identifier member.

14. The method of claim 9, wherein inputting the measurement tolerance data includes connecting a keyboard to the meter.

15. The method of claim 9, wherein inputting the measurement tolerance data includes communicating serially with the memory.

16. The method of claim 9, further comprising:
disconnecting the at least one electrical device from the meter;
connecting a another electrical device to the meter, the new electrical device including measurement tolerance data provided on an identifier member;
inputting the measurement tolerance data associated with the another electrical device to the memory operatively associated with the meter; and
calibrating measurement accuracy of the meter based on, at least in part, the measurement tolerance data of the another electrical device.

17. The method of claim 9, further comprising:
electrically interconnecting a plurality of electrical devices with the meter;
obtaining measurement tolerance data associated with each of the plurality of electrical devices, the measurement tolerance data being provided on an identifier member associated with each of the plurality of electrical devices;
inputting the measurement tolerance data to the memory operatively associated with the meter; and
calibrating measurement accuracy of the meter based on the measurement tolerance data associated with each of the plurality of electrical devices.

* * * * *